s008000659B2" />

United States Patent
Nakamura et al.

(10) Patent No.: US 8,000,659 B2
(45) Date of Patent: Aug. 16, 2011

(54) POLAR MODULATION TRANSMISSION APPARATUS

(75) Inventors: Maki Nakamura, Osaka (JP); Shigeru Morimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 789 days.

(21) Appl. No.: 11/963,916

(22) Filed: Dec. 24, 2007

(65) Prior Publication Data
US 2008/0160934 A1    Jul. 3, 2008

(30) Foreign Application Priority Data
Dec. 27, 2006  (JP) ................................ 2006-351716

(51) Int. Cl.
*H04B 1/04*   (2006.01)
(52) U.S. Cl. .................. 455/110; 455/115.1; 455/127.1; 375/297; 375/302
(58) Field of Classification Search .................. 455/108, 455/110, 115.1, 115.3, 127.1, 127.2; 375/297, 375/300, 302; 330/10, 51, 136, 207 A, 251, 330/295, 297
See application file for complete search history.

(56) References Cited

U.S. PATENT DOCUMENTS

| | | | |
|---|---|---|---|
| 6,047,168 | A | 4/2000 | Carlsson |
| 6,566,944 | B1 | 5/2003 | Pehlke |
| 6,998,919 | B2 * | 2/2006 | Gamero et al. ............... 330/289 |
| 7,359,680 | B2 * | 4/2008 | Klemmer ..................... 455/110 |
| 7,457,592 | B2 * | 11/2008 | Arayashiki ................... 455/108 |
| 2004/0247041 | A1 | 12/2004 | Biedka |
| 2005/0156669 | A1 | 7/2005 | Ando |
| 2008/0085684 | A1 * | 4/2008 | Phillips et al. ............. 455/114.3 |

FOREIGN PATENT DOCUMENTS

| | | |
|---|---|---|
| EP | 1093222 | 4/2001 |
| JP | 2000-295055 | 10/2000 |
| JP | 2005-236958 | 9/2005 |
| WO | 02101944 | 12/2002 |
| WO | 2005041438 | 5/2005 |

OTHER PUBLICATIONS

International Search Report Dated Jan. 29, 2008.
Chinese Office Action dated Jan. 7, 2011.

* cited by examiner

*Primary Examiner* — Quochien B Vuong
(74) *Attorney, Agent, or Firm* — Dickinson Wright PLLC

(57) ABSTRACT

A polar modulation transmission apparatus is disclosed, which reduces the circuit scale by removing isolators and which reduces the heat loss of a power amplifier. In this apparatus, current detecting section 130 detects current value Icc of current flowing from power supply voltage section 120 to power amplifier 180, and power control section 140 outputs control signal S31 to power apply section 150 based on power control signal S30 to be inputted and current value Icc. Power apply section 150 forms amplitude modulation signal S13 by multiplying baseband amplitude modulation signal S11 by control signal S31, and regulator 160 supplies to power amplifier 180 power supply voltage S22 converted into power supply voltage S21 by amplitude modulation signal S13. Power amplifier 180 obtains RF transmission signal S15 by amplifying the power of phase modulation high-frequency signal S14 as the power supply of power supply voltage S22.

5 Claims, 16 Drawing Sheets

| INPUT VALUE (DETECTED CURRENT VALUE) | OUTPUT VALUE (OUTPUT LIMIT VALUE) |
|---|---|
| ~ 750mA | 2.9 (23dBm) |
| 750 ~ 700mA | 3.2 (24dBm) |
| 700 ~ 650mA | 3.5 (25dBm) |
| 650mA ~ | 3.8 (26dBm) |

FIG.10

| INPUT VALUE (SUPPLY POWER VALUE) | OUTPUT VALUE (OUTPUT LIMIT VALUE) |
|---|---|
| ~1000mW | 2.9 (23dBm) |
| 1000mW~ | 3.8 (26dBm) |

FIG. 14

POLAR MODULATION TRANSMISSION APPARATUS

CROSS REFERENCE TO RELATED APPLICATIONS

The disclosure of Japanese Patent Application No. 2006-351716 filed on Dec. 27, 2006 including the specification, drawings and abstract, is incorporated herein by reference in its entirety.

BACKGROUND OF THE INVENTION

1. Field of the Invention

The present invention specifically relates to a transmission apparatus using a polar modulation scheme.

2. Description of the Related Art

In the design of conventional transmission modulation apparatuses, there is generally a trade-off between efficiency and linearity. Recently, however, a technology has been proposed that enables compatibility between efficiency and linearity to be achieved in a transmission modulation apparatus by using polar modulation.

FIG. 1 is a block diagram showing a sample configuration of a transmission modulation apparatus employing polar modulation.

Polar coordinate change section 11 divides a baseband modulation signal into baseband amplitude modulation signal S1 representing the amplitude component (for example, $\sqrt{I^2+Q^2}$) and baseband phase modulation signal S2 representing the phase component (for example, the angle formed by the modulation symbol and the I-axis).

Power supply voltage change section 12 changes power supply voltage S3 supplied from a power supply (not shown) into power supply voltage S4 and outputs changed power supply voltage 4 to regulator 14.

Power apply section 13 forms amplitude modulation signal S6 by multiplying baseband amplitude modulation signal S1 with control signal S5.

Regulator 14 (changes power supply voltage S4 using amplitude modulation signal S6. Further, regulator 14 supplies power supply voltage S8, which is obtained by changing power supply voltage S4 using amplitude modulation signal S6, to a power supply input terminal of power amplification section 16.

Phase modulation section 15 changes a high-frequency signal into phase modulation high-frequency signal S7 by phase modulation using baseband phase modulation signal S2.

Power amplifier 16 amplifies phase modulation high-frequency signal S7 using power supply voltage S8 as a power supply and outputs RF transmission signal S9, which is obtained by amplifying the power of phase modulation high-frequency signal S7, to isolator 17.

Isolator 17 allows radio waves to pass in a certain direction without attenuation but absorbs the power of the radio waves in the opposite direction. By this means, it is possible to prevent a signal received at antenna 18 from entering power amplifier 16. Further, since isolator 17 is provided, even if the load of antenna 18 fluctuates, the negative influence does not extend to power amplifier 16, so that the operation of power amplifier 16 does not become unstable. Further, the S/N ratio of the output signal of power amplifier 16 is prevented from being deteriorated. Thus, isolator 17 prevents a reflected signal from antenna 18 from being conveyed to power amplifier 16 and has no influence to power amplifier 16 according to the load fluctuation of antenna 18.

Antenna 18 transmits RF transmission signal 10.

When transmission modulation apparatus 10 employing the above-described configuration is used for terminals such as mobile phones, isolator 17 is provided so as to stabilize the characteristics of power amplifier 16. On the other hand, the insertion of isolator 17 causes power loss and results in an increase of the area occupied by transmission modulation apparatus 10.

Although removing isolator 17 from transmission modulation apparatus 10 would solve the problem of power loss and the problem of increased area, the characteristics of power amplifier 16 becomes unstable. That is, by removing isolator 17 from transmission modulation apparatus 10, the load of power amplifier 16 is prone to fluctuation.

To be more specific, in the case of mobile terminals such as mobile phones, the use environment changes variously, and, accompanying this, the load of power amplifier 16 (the load of antenna 18) fluctuates sensitively. For example, during a call, when the case of the device is close to the human body or when a mobile phone is used near a metal desk, the antenna of the mobile phone is capacitive-coupled with the human body or a metal board, and the load of the transmission modulation apparatus fluctuates significantly.

This load fluctuation increases the current value $I_{CC}$ of the current flowing from power supply voltage change section 12 to power amplifier 16, and decreases the output power of power amplifier 16. As a result, there is a problem that the power loss of power amplifier 16 is increased as shown in equation 1 and the temperature of power amplifier 16 significantly increases by heat converted from the power loss of power amplifier 16.

[1]

$$\text{Power loss} = \text{supply power}(V_{cc}I_{CC}) - \text{output power}(P_{out}) \quad \text{(Equation 1)}$$

As described above, there is a problem that load fluctuation makes the power loss of a power amplifier increase and the increased power loss makes the amount of heat produced in the power amplifier increase. Therefore, in a mobile phone mounting the above-described transmission modulation apparatus, the temperature of the case increases to high temperature and its life and characteristics degrade. In particular, in a mobile phone touching the human body upon use, it is difficult to use the mobile phone when the surface temperature of the mobile phone main body becomes high. Therefore, a problem of an increase of the amount of heat produced in the power amplifier is posed.

To solve these problems, Patent Document 1 discloses a method of estimating load fluctuation by detecting the current of a power amplifier, and controlling to reduce load fluctuation of variable load in a power amplifier output terminal. FIG. 2 illustrates a configuration of main components of the polar modulation transmission apparatus disclosed in Patent Document 1.

As disclosed in Patent Document 1, to reduce negative influence caused by the load fluctuation of a power amplifier, a circuit for estimating the load fluctuation of the power amplifier and a circuit for controlling the load may be provided in the polar modulation transmission apparatus.

However, the scale of a circuit for estimating load fluctuation or controlling the load becomes larger. Therefore, when the circuit is applied to terminals such as mobile phones, it is hard to make these terminals smaller.

Patent Document 1: Japanese Patent Application Laid-Open No. 2000-295055.

SUMMARY OF THE INVENTION

It is therefore an object of the present invention is to provide a polar modulation transmission apparatus for reducing the circuit scale by removing isolators, and controlling the heat loss of a power amplifier.

The present invention achieves the above object by employing a configuration having: a power amplifier that amplifies power of a phase component signal of a predetermined signal; a power supply; a regulator that changes a power supply voltage of the power supply according to an amplitude component signal of the predetermined signal and supplies the power supply voltage to a power supply input terminal of the power amplifier; a current detecting section that detects a value of current flowing from the power supply to the power amplifier; a power control section that limits a value of a transmission power control signal specifying transmission power, based on the current value detected in the current detecting section; and a power apply section that amplifies the amplitude component signal of the predetermined signal based on the transmission power control signal outputted from the power control section.

BRIEF DESCRIPTION OF THE DRAWINGS

FIG. 10 illustrates a relationship between a threshold and a control signal;

FIG. 14 illustrates a relationship between a threshold and a control signal;

DETAILED DESCRIPTION OF THE PREFERRED EMBODIMENT

Embodiments of the present invention will be explained below in detail with reference to the accompanying drawings.

The present inventors have found a high correlation between the amount of power loss of the power amplifier, caused by the fluctuation of the phase component of the load, and the power supply current value of the power amplifier. This will be explained with reference to FIG. 3.

Figure 1:
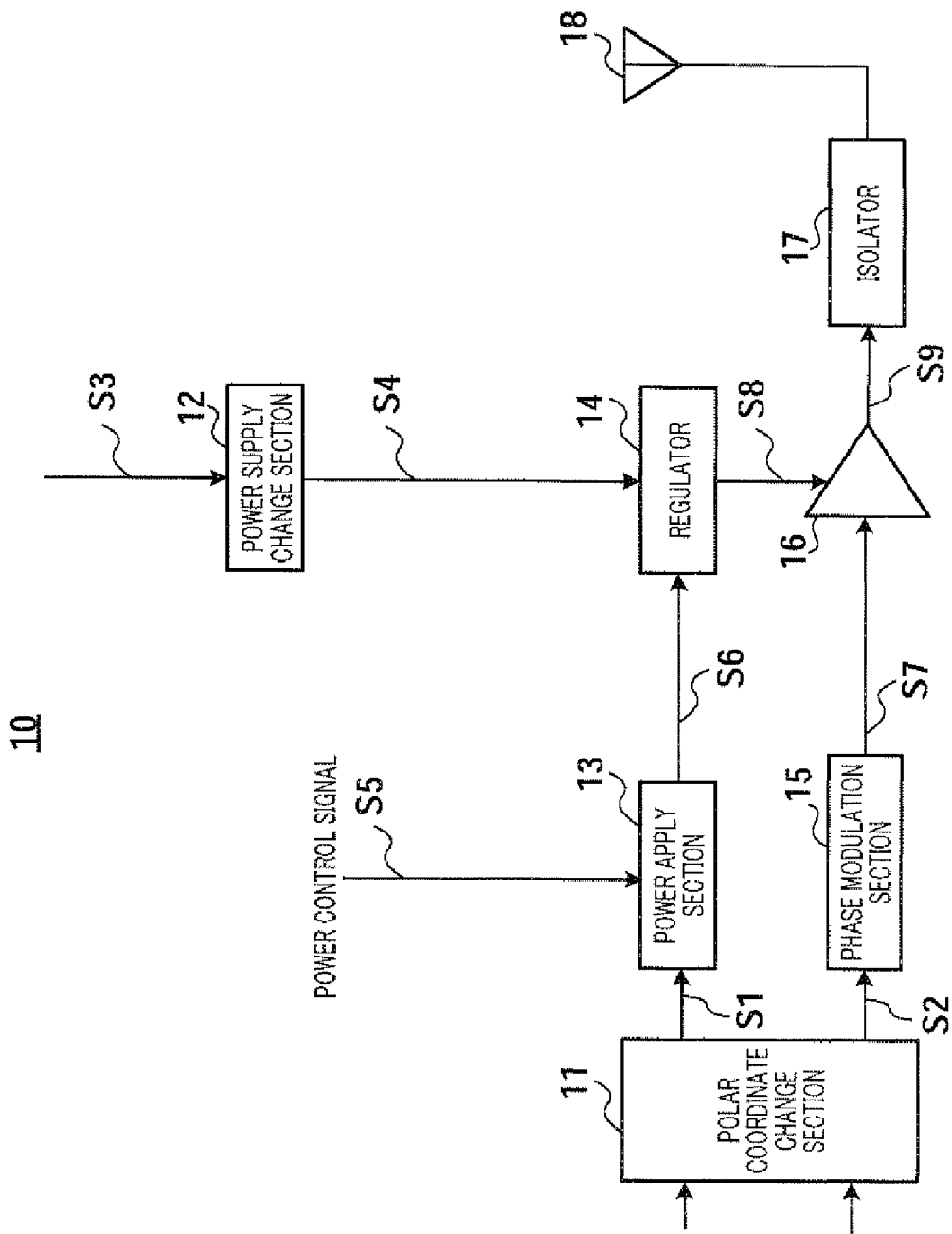
FIG. 1 is a block diagram showing a configuration of main components of a polar modulation transmission apparatus of the conventional polar modulation scheme.
Figure 2:
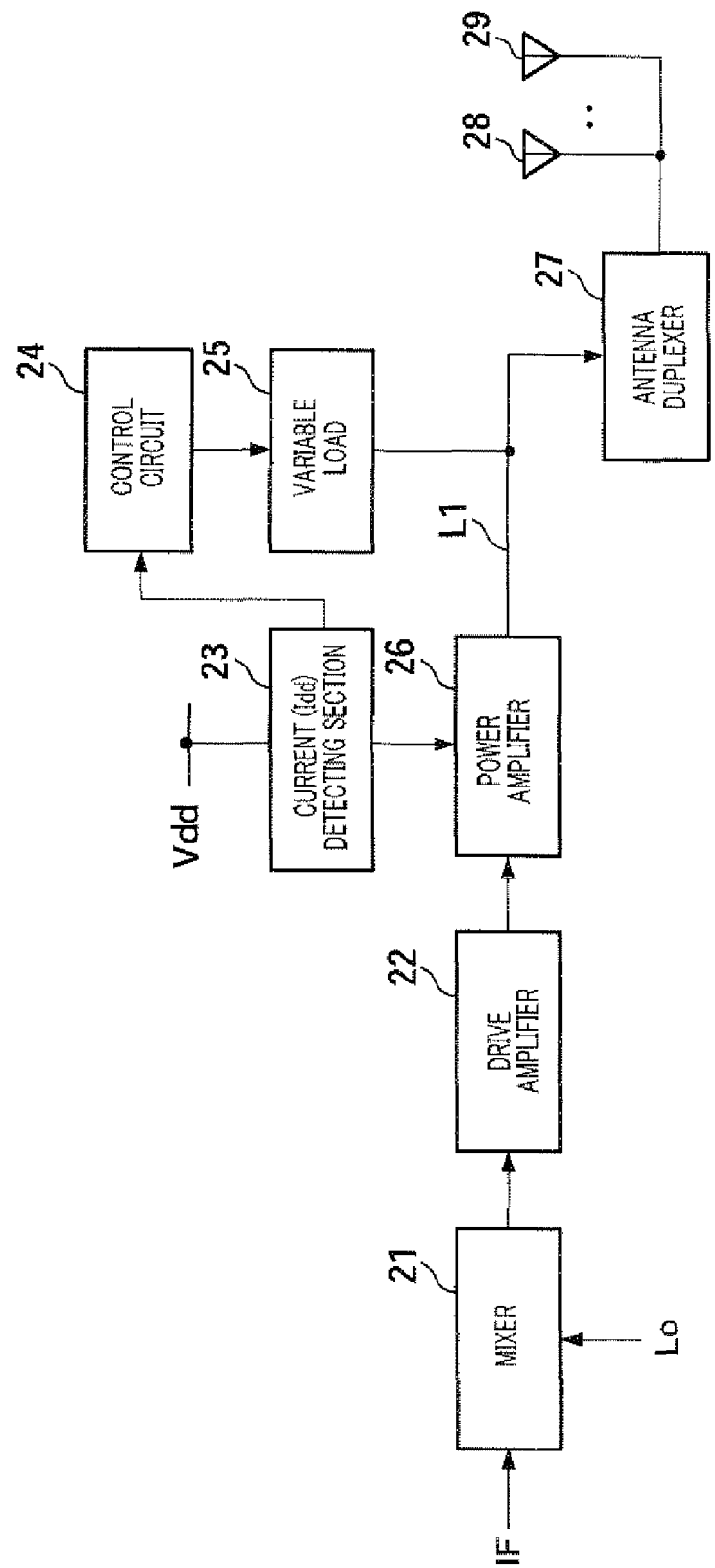
FIG. 2 is a block diagram showing a configuration of main components of a conventional isolator-less polar modulation transmission apparatus.
Figure 3:
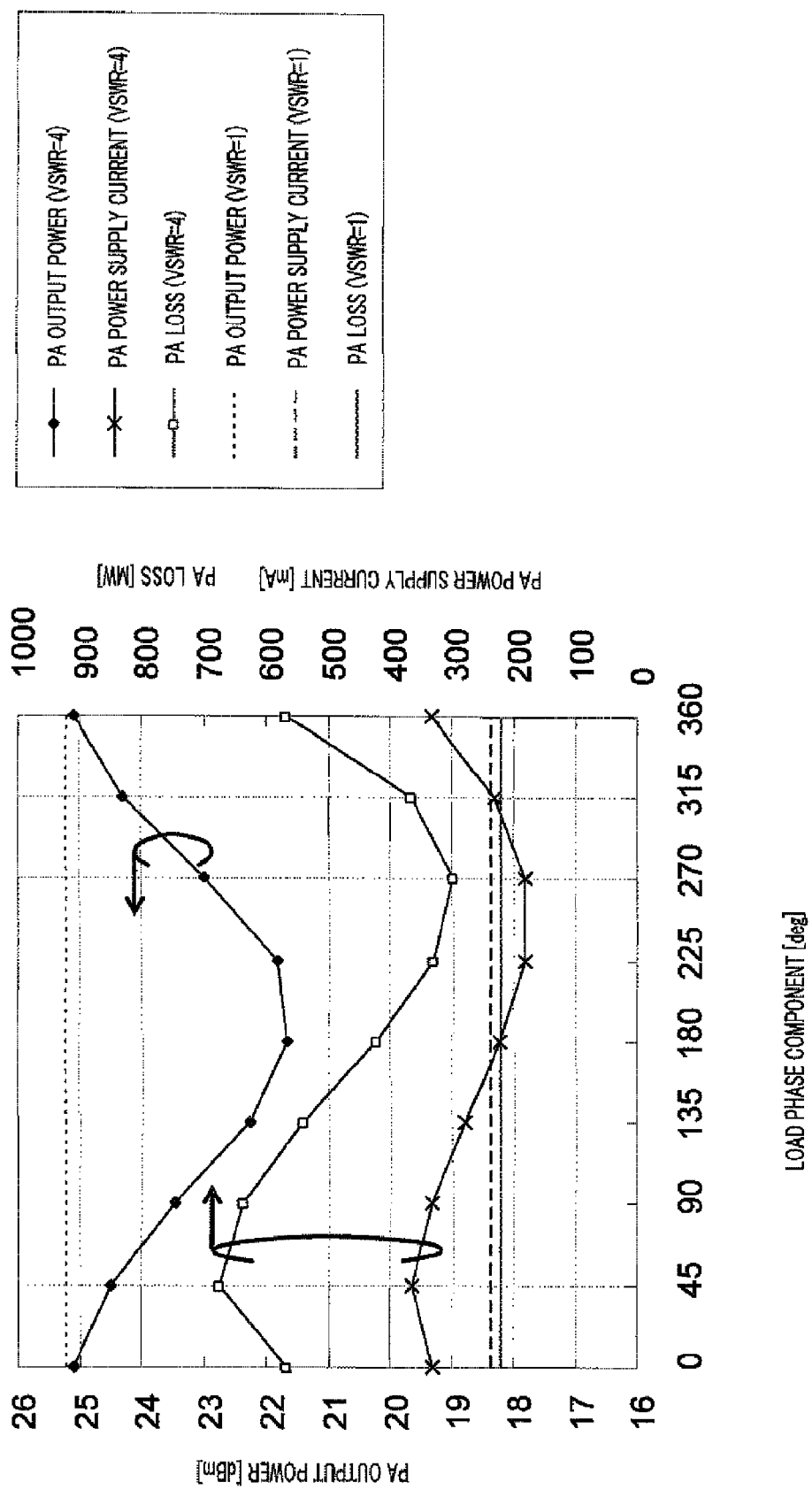
FIG. 3 illustrates a relationship between the amount of power loss of a power amplifier and the power supply current value for the power amplifier.

FIG. 3 illustrates the phase of the load when isolator 17 is removed from the configuration of FIG. 1, a load reflection coefficient is constant (VSWR is fixed to 4) and only the phase component is fluctuated, and the output cower value for a power amplifier. In FIG. 3, the horizontal axis shows the phase of the load, and the vertical axis shows the output power value for a power amplifier. Further, FIG. 3 illustrates the relationship between the amount of power loss of the power amplifier and the power supply current value for the current, flowing from power supply power change section 12 to power amplifier 16. Further, for reference, FIG. 3 shows the value at which load does not fluctuate (VSWR=1) in dot-lines.

As shown in FIG. 3, when the phase component of the load fluctuates, the amount of power loss in power amplifier 16, the output power value for power amplifier 16 and the power supply current value for the current, flowing from power supply voltage change section 12 to power amplifier 16, fluctuate together.

Here, focusing on the amount of power loss of the power amplifier and the power supply current value, as shown in FIG. 3, it is clear that there is a high correlation between the amount of power loss of the power amplifier, caused by the phase component of the load, and the power supply current value for the power amplifier.

The present inventors focus on this point. To be more specific, the present inventors have considered that the loss of power amplifier 16 can be reduced efficiently if power control of power amplifier 16 is performed based on the current value for the current, flowing from power supply voltage change section 12 to power amplifier 16, by utilizing the correlation between the amount of power loss of power amplifier 16 and the power supply current value for power amplifier 16, and have arrived at the present invention.

Embodiment 1

Figure 4:
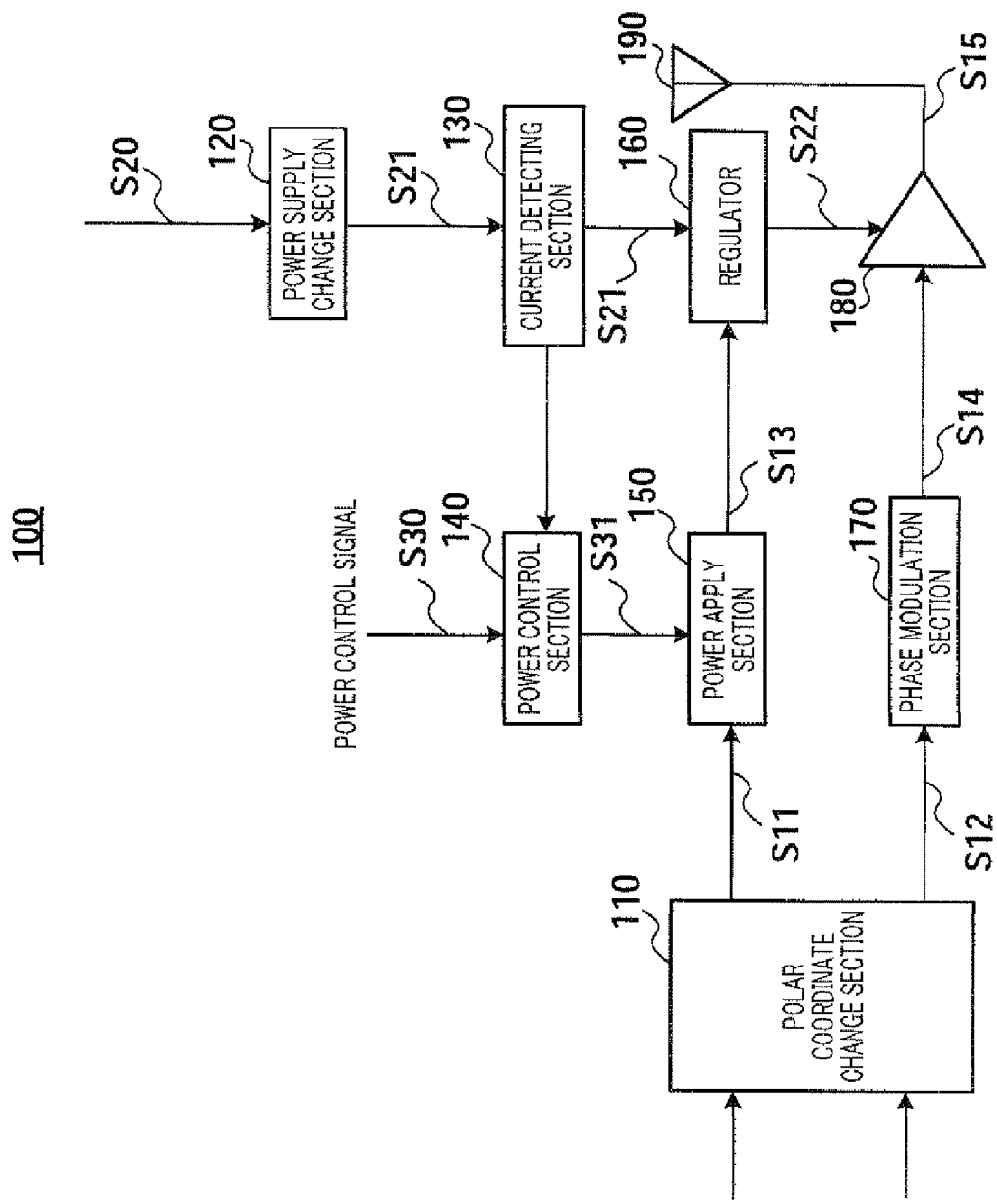
FIG. 4 is a block diagram showing a configuration of main components of a polar modulation transmission apparatus according to Embodiment 1 of the present invention.

FIG. 4 illustrates a configuration of main components of the polar modulation transmission apparatus according to the present embodiment. Polar modulation transmission apparatus 100 is mounted in radio communication apparatuses such as mobile phones and base station apparatuses for mobile phones.

In FIG. 4, polar modulation transmission apparatus 100 employs a configuration having polar coordinate conversion section 110, power supply voltage change section 120, current detecting section 130, power control section 140, power apply section 150, regulator 160, phase modulation section 170, power amplifier 180 and antenna 190.

Polar coordinate conversion section 110 divides a baseband modulation signal into baseband amplitude modulation signal S11 representing the amplitude component (for example, $\sqrt{I^2+Q^2}$) and baseband phase modulation signal S12 representing the phase component (for example, the angle formed by the modulation symbol and the I-axis).

Power supply voltage change section 120 changes power supply voltage S20 supplied from a power supply (not shown) into power supply voltage S21 and outputs changed power supply voltage S21 to current detecting section 130 and regulator 160.

Current detecting section 130 detects current value $I_{cc}$ of the current, flowing from power supply voltage change section 120 to power amplifier 180, and outputs detected current value $I_{cc}$ to power control section 140.

Power control section outputs control signal S31 to power apply section 150 based on inputted power control signal S30 and current value $I_{cc}$ detected in current detecting section 130. Here, power control signal S30 is for controlling transmission power of RF output signal S15 transmitted from antenna 190, and sets the level of transmission power for RF output signal S15 lower when tale distance between polar modulation transmission apparatus 100 and the communicating party apparatus is close, and sets the level of transmission power higher when the distance between polar modulation transmission apparatus 100 and the communicating party apparatus is far. Power control section 140 will be described later in detail.

Power apply section 150 forms amplitude modulation signal S13 by multiplying baseband amplitude modulation signal S11 with control signal S31.

Regulator 160 changes power supply voltage S21 into power supply voltage S22 by amplitude modulation signal S13 and supplies changed power supply voltage S22 to power amplifier 180.

Phase modulation section 170 changes a high-frequency signal into phase modulation high-frequency signal S14 by phase modulation using baseband phase modulation signal S12.

Power amplifier 180 obtains RF transmission signal S15 by amplifying the power of phase modulation high-frequency signal S14 using power supply voltage S22 as power supply, and outputs obtained RF transmission signal S15 to antenna 190.

Antenna 190 transmits RF transmission signal S15.

Figure 5:
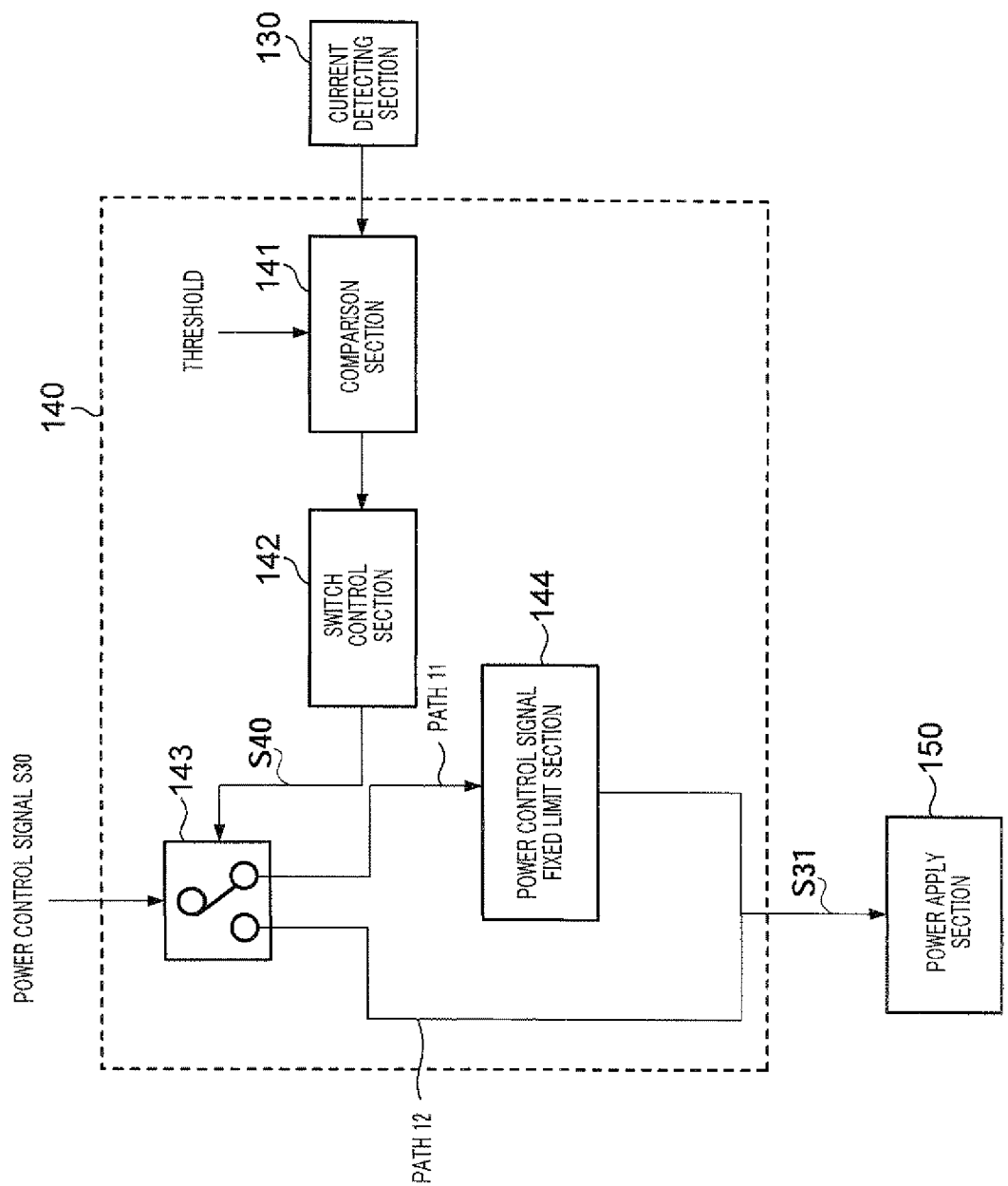
FIG. 5 is a block diagram showing a configuration of main components of a power control section according to Embodiment 1.

FIG. 5 is a block diagram showing a configuration of main components of power control section 140.

In FIG. 5, power control section 140 employs a configuration having comparison section 141, switch control section 142, switch 143 and power control signal fixed limit section 144.

Comparison section 141 compares current value $I_{cc}$, outputted from current detecting section 130, to a predetermined threshold, and outputs the result of comparison to switch control section 142.

Switch control section 142 outputs to switch 143 control signal S40 for changing the path for switch 143 according to the result of comparison in comparison section 141. Specifically, switch control section 142 outputs to switch 143 control signal S40 for changing the path to path 11 when the result of comparison shows that current value $I_{cc}$ is greater than the threshold and for changing the path to path 12 when the result of comparison shows that current value $I_{cc}$ is equal to or less than the threshold.

Switch 143 changes the path for power control signal S30 to path 11 or path 12 according to power control signal S30 to be inputted and S40 outputted from switch control section 142.

When power control signal S30 is inputted via switch 143, power control signal fixed limit section 144 compares power control signal S30 to fixed power control signal S32 provided in power control signal fixed limit section 144, and outputs as control signal S31 the signal having the lower value to power apply section 150.

Thus, when the result of comparison in comparison section 141 shows that current value $I_{cc}$ is equal to or less than the threshold, power control section 140 outputs power control signal S30 as control signal S31 to power apply section 150. On the other hand, when the result of comparison shows that current value $I_{cc}$ is greater than the threshold, power control section 140 outputs to power apply section 150 the signal having the lower value between power control signal S30 and fixed power control signal S32, as control signal S31.

In the operations of polar modulation transmission apparatus 100 employing the above-described configuration, the operation of power control section 140 will be mainly explained below.

First, comparison section 141 of power control section 140 compares current value $I_{cc}$, outputted from current detecting section 130, to a predetermined threshold, and the result of comparison is outputted to switch control section 142. When the result of comparison shows that current value $I_{cc}$ is equal to or less than the threshold, switch control section 142 outputs to switch 143 control signal S40 for changing the path for power control signal S30 to path 12. By contrast, when the result of comparison shows that current value $I_{cc}$ is greater than the threshold, switch control section 142 outputs to switch 143 control signal S40 for changing the path for power control signal S30 to path 11.

Thus, when the result of comparison shows that current value $I_{cc}$ is greater than the threshold, power control signal S30 is outputted to power control signal fixed limit section 144, and, when the result of comparison shows that current value $I_{cc}$ is equal to or less than the threshold, power control signal S30 is directly outputted to power apply section 150.

When power control signal S30 is inputted, power control signal fixed limit section 144 outputs to power apply section 150 the signal having the lower value between power control signal S30 and fixed power control signal S32, as control signal S31.

When the value for fixed power control signal S32 is lower than the input value for power control signal S30, power control signal fixed limit section 144 outputs fixed power control signal S32. Therefore, when fixed power control signal S32 is outputted to power apply section 150 as control signal S31, the level of amplitude modulation signal S13 formed in power apply section 150 is limited. Regulator 160 changes power supply voltage S21 using amplitude modulation signal S13, and, when amplitude modulation signal S22 becomes smaller, reduces power supply voltage S22 supplied to power amplifier 180. That is, by reducing the power supplied to power amplifier 180, it is possible to reduce the power loss. As a result, it is possible to reduce an increase of temperature of power amplifier 180 by power loss.

Figure 6:
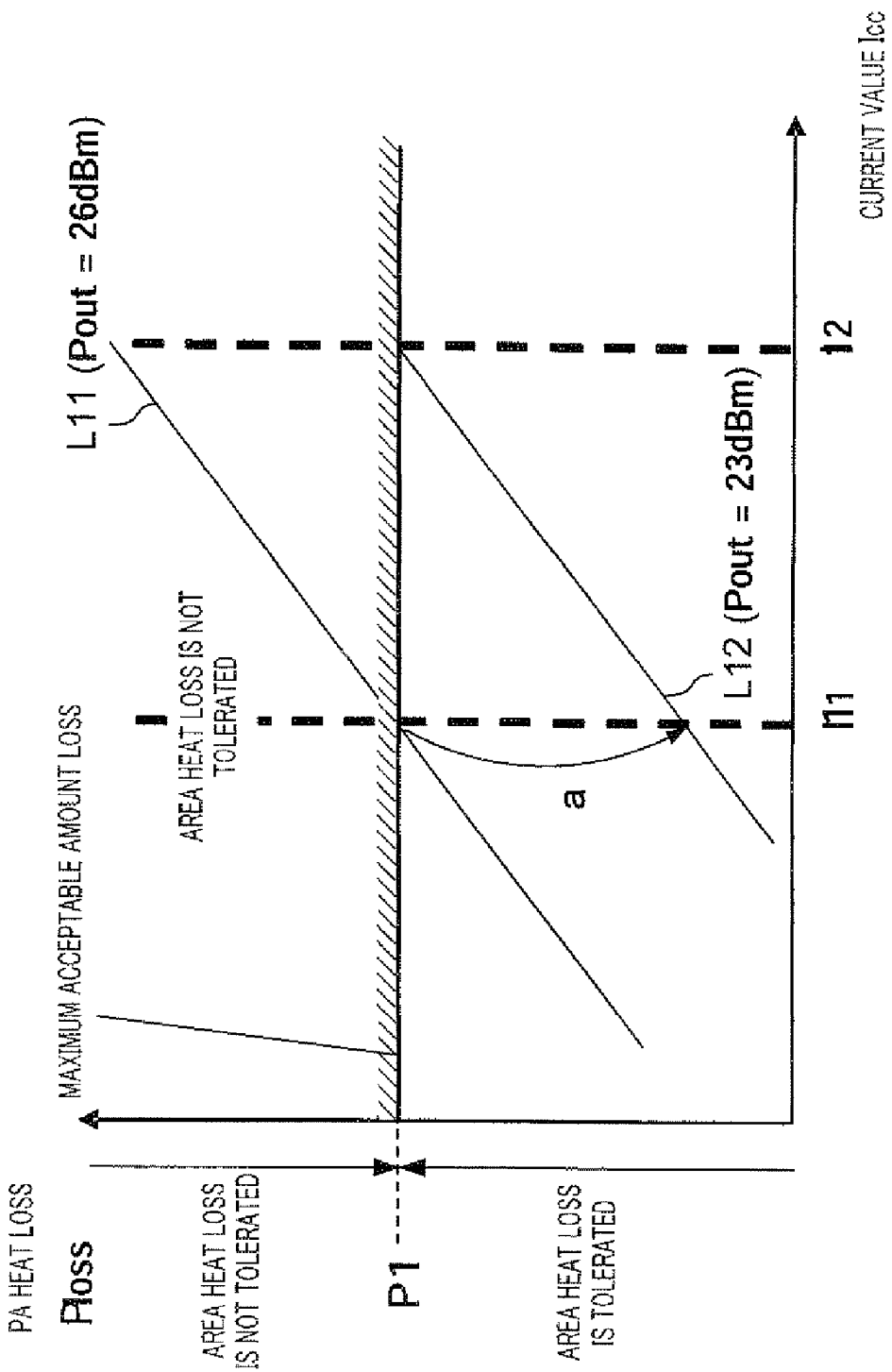
FIG. 6 illustrates a relationship between the power current value for power supply voltage and the heat loss of power amplifier.

FIG. 6 illustrates an operation of power control section 140 for explanation. In FIG. 6, the horizontal axis is current value $I_{cc}$ and the vertical axis is heat loss, $P_{loss}$. Further, in FIG. 6, when the set value for power control signal S30 is approximately 26 dBm, upward slope L11 shows the relationship between changes in current value $I_{cc}$ of when the load fluctuations, and resulting heat loss $P_{loss}$. Further, in FIG. 6, when the set value for power control signal S30 is approximately 23 dBm, upward slope L12 shows the relationship between changes in current value $I_{cc}$ of when the load fluctuations, and resulting heat loss $P_{loss}$. Further, in FIG. 6, when the set value for power control signal S30 is approximately 26 dBm, I11 shows the maximum value for current value $I_{cc}$ that makes heat loss $P_{loss}$ equal to or lower than fixed value P1. Further, in FIG. 6, when the set value for power control signal S30 is approximately 23 dsm, I12 shows the maximum value for current value $I_{cc}$ that makes heat loss $P_{loss}$ equal to or less than fixed value P1. As shown in FIG. 6, when output power $P_{out}$ set for power control signal S30 becomes greater, the maximum value for current value $I_{cc}$ that makes heat loss $P_{loss}$ equal to or lower than certain value P1 becomes lower (I12>I11).

For example, when the set value for power control signal S30 is approximately 26 dBm and load fluctuation causes current value $I_{cc}$ greater than I11, power control section 140 outputs to power apply section 150 fixed power control signal S32 having a lower value than power control signal S30 (for example, the set value is approximately 23 dBm) as control signal S31. Power apply section 150 forms amplitude modulation signal S13 by multiplying baseband amplitude modulation signal S11 with control signal S31.

Regulator 160 changes power supply voltage S21 into power supply voltage S22 using amplitude modulation signal S13 and outputs this power supply voltage S22 to power amplifier 180.

Thus, when amplitude modulation signal S13 is obtained by outputting as control signal S31 fixed power control signal S32 from power control section 140 to fixed apply section 150, an amplification rate for changing baseband amplitude modulation signal S11 into amplitude modulation signal S13 becomes lower than when amplitude modulation signal S13 is obtained by outputting as control signal S31 power control signal S30 from power control section 140 to fixed apply section 150. As a result, output power $P_{out}$ of power amplifier 180 is reduced from 26 dBm to, for example, 23 dBm (see arrow "a" in FIG. 6), so that it is possible to reduce the heat loss and reduce an increase of temperature of power amplifier 180.

As described above, according to the present embodiment, power control section 140 controls the value for control signal S31 outputted to power apply section 150 based on current value $I_{cc}$ in power supply voltage change section 120, so that it is possible to limit the maximum output power of power amplifier 180 and reduce the heat loss of power amplifier 180. That is, when current value $I_{cc}$ is large, it is possible to reduce the amplification rate in power apply section 150 by outputting to power apply section 150 fixed power control signal S32 having the lower value than power control signal S30 as control signal S31, instead of power control signal S30. By this means, the amplitude level of generated amplitude modulation signal S12 becomes lower and power supply voltage S22 supplied to power amplifier 180 via regulator 160 becomes lower, so that it is possible to reduce the power loss in the supply line for power supply to power amplifier 180 and reduce the heat loss.

Further, the configuration of power control section 140 in the above explanation is not limited to the configuration having comparison 141, switch control section 142, switch 143, power control signal fixed limit section 144, and power control section 140 may employ a configuration having a comparison section and memory, and output fixed power control signal S32 stored in the memory in advance as control signal S31 when the current value $I_{cc}$ is greater than a predetermined threshold.

Embodiment 2

The hardware configuration of the polar modulation transmission apparatus according to Embodiment 2 of the present invention is the same as FIG. 4 and explanations thereof will be omitted.

Figure 7:
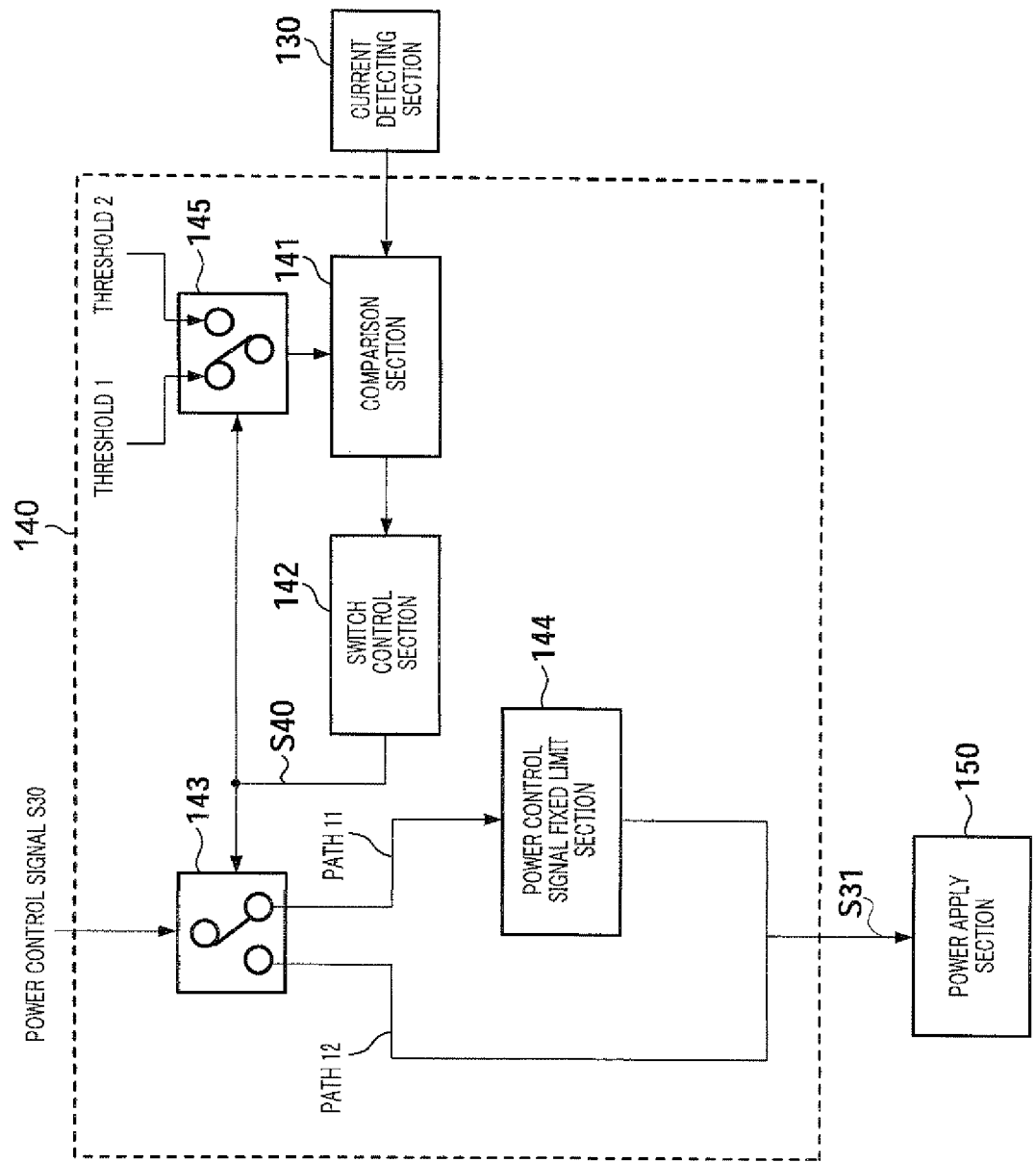
FIG. 7 is a block diagram showing a configuration of main components of a power control section according to Embodiment 2 of the present invention.

FIG. 7 is a block diagram showing the configuration of main components of power control section 140 according to Embodiment 2 of the present invention. For ease of explanation, the same components as in FIG. 5 are assigned the same reference numerals and detailed explanations thereof will be omitted. This embodiment is different from Embodiment 1 in that power control section 140 has switch 145 as second switch for changing the threshold in comparison section 141.

Switch 145 changes the threshold in comparison section 141 in accordance with control signal S40. Control signal S40 is outputted from switch control section 143 for changing the path at switch 143. To be more specific, when switch control section 142 outputs control signal S40 to change the path to path 11, switch 145 changes the threshold in comparison section 141 from threshold 1 to threshold 2 (threshold 1>threshold 2). On the other hand, when switch control section 142 outputs control signal S40 to change the path to path 12, switch 145 changes the threshold in comparison section 141 from threshold 2 to threshold 1

In the operations of polar modulation transmission apparatus 100 employing the above-described configuration, the operation of power control section 140 will be mainly explained below.

First, comparison section 141 of power control section 140 compares current value $I_{cc}$ outputted from current detecting section 130 to the predetermined threshold, and outputs the result of comparison to switch control section 142. When the result of comparison shows that current value $I_{cc}$ is equal to or less than the threshold, switch control section 142 outputs to switch 143 and switch 145 control signal S40 for changing the path for power control signal S30 to path 12. On the other hand, when the result of comparison shows that current value $I_{cc}$ is greater than the threshold, switch control section 142 outputs to switch 143 and switch 145 control signal S40 for changing the path for power control signal S30 to path 11.

When current value $I_{cc}$ is greater than threshold 1 and the limit for output power $P_{out}$ of power amplifier 180 is started, switch 145 changes the threshold in comparison section 141 from threshold 1 to threshold 2 (threshold 1>threshold 2). By doing so, when current value $I_{cc}$ is equal to or less than threshold 2, switch 145 changes the path for power control signal S30 from path 11 to path 12, and the limit is cancelled for output power $P_{out}$ of power amplifier 180. Then, switch 145 changes the threshold in comparison section 141 from threshold 2 to threshold 1.

Thus, by selecting the threshold for canceling the limit for output power $P_{out}$ of power amplifier 180 so as to be equal to or less than the threshold for canceling the limit, hysteresis is formed with respect to current value $I_{cc}$ between when the limit is started and when the limit is cancelled. When the threshold for current value $I_{cc}$ for starting limiting output power $P_{out}$ of power amplifier 180 and the threshold for current value $I_{cc}$ for canceling the limit are the same, hysteresis with respect to current value $I_{cc}$ is not formed, and the path for power control signal S30 is changed and the maximum output power of power amplifier 180 fluctuates every time current value $I_{cc}$ changes a little across the threshold. On the other hand, when the threshold for canceling the limit of output power $P_{out}$ of power amplifier 180 is equal to or less than the threshold for starting limiting output power $P_{out}$ of power amplifier 180, hysteresis is formed with respect to current value $I_{cc}$, and the path for power control signal S30 does not change following little fluctuation of current value $I_{cc}$, so that uniform transmission power can be obtained.

Power control signal S30 is outputted to power control signal fixed limit section 144 or power apply section 150 according to control signal S40 outputted from switch control section 142.

When power control signal S30 is inputted, power control signal fixed limit section 144 outputs to power apply section 150 the signal having the lower value between power control signal S30 and fixed power control signal S32, as control signal S31.

When the value for fixed power control signal S32 is lower than the input value for power control signal S30, power control signal fixed limit section 144 outputs fixed power control signal S32. Therefore, when fixed power control signal S32 is outputted as control signal S31 to power apply section 150, the level of amplitude modulation signal S13 formed in power apply section 150 is limited. Regulator 160 changes power supply voltage S21 using amplitude modulation signal S13, and, when amplitude modulation signal S13 becomes smaller, reduces power supply voltage S22 supplied to power amplifier 180. That is, by reducing the power supplied to power amplifier 180, it is possible to reduce the power loss. As a result, it is possible to reduce an increase of temperature of power amplifier 180 using the power loss.

As described above, according to the present embodiment, threshold 2, which is less than threshold 1 for starting limiting the maximum output power of power amplifier 180, is used as the threshold for canceling the limit for the maximum output power of power amplifier 180, so that hysteresis is formed with respect to current value $I_{cc}$ between when the limit for maximum output power of power amplifier 180 is started and when the limit is cancelled. When the threshold for current value $I_{cc}$ for starting limiting output power $P_{out}$ of power amplifier 180 and the threshold for current value $I_{cc}$ for canceling the limit are the same, and hysteresis or current value $I_{cc}$ is not formed, the maximum output power of power amplifier 180 fluctuates every time current value $I_{cc}$ changes a little across the threshold. On the other hand, when the threshold for canceling the limit of output power $P_{out}$ of power amplifier 180 is equal to or less than the threshold for starting limiting output power $P_{out}$ of power amplifier 180, hysteresis is formed with respect to current value $I_{cc}$, so that uniform transmission power can be obtained even if current value $I_{cc}$ fluctuates a little.

Embodiment 3

Figure 8:
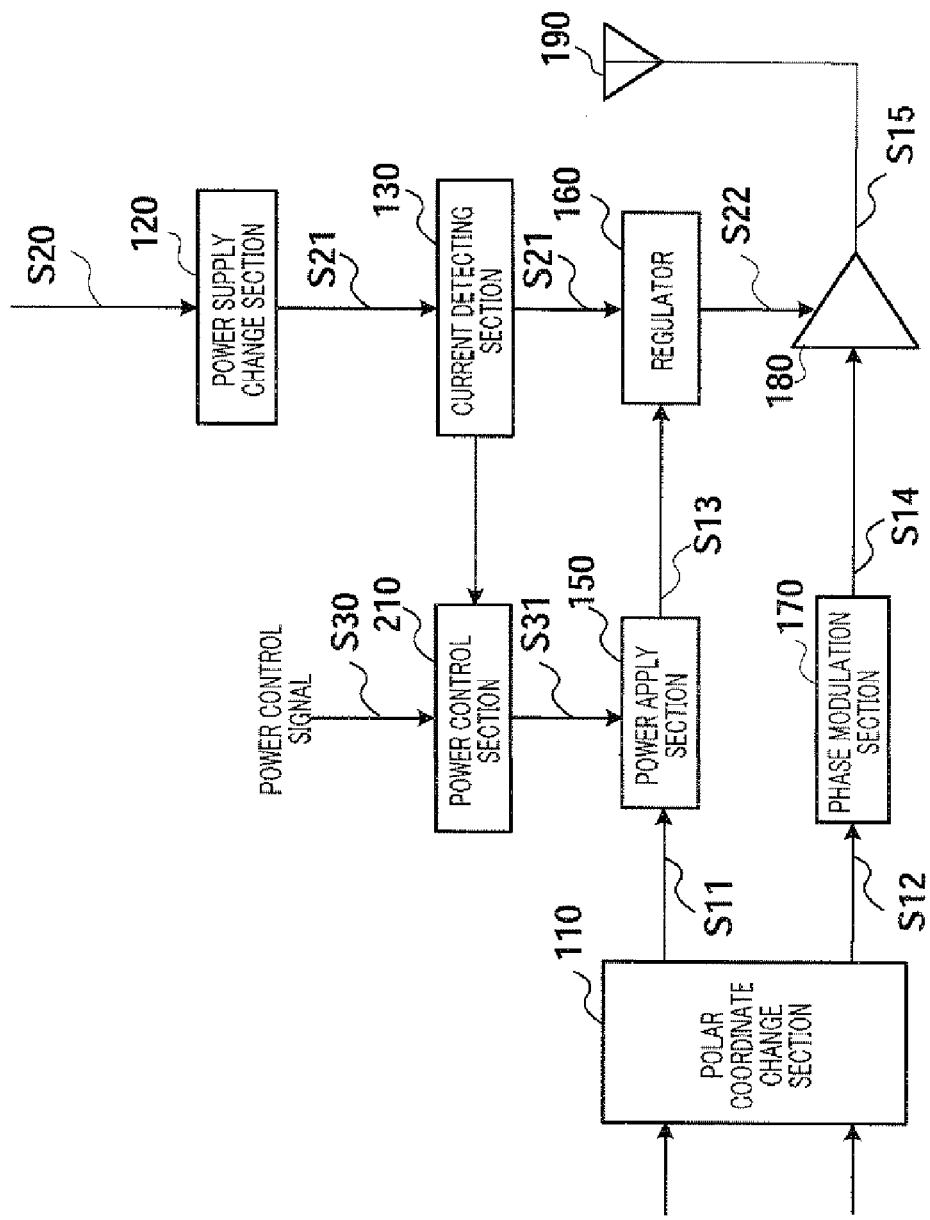
FIG. 8 is a block diagram showing a configuration of main components of a polar modulation transmission apparatus according to Embodiment 3 of the present invention.

FIG. 8 is a block diagram showing the configuration of main components of the polar modulation transmission apparatus according to Embodiment 3 of the present invention. For ease of explanation, the same components as in FIG. 4 are assigned the same reference numerals and detailed explanations thereof will be omitted. The present embodiment is different from Embodiment 1 in that polar modulation transmission apparatus 200 has power control section 210, instead of power control section 140.

Figure 9:
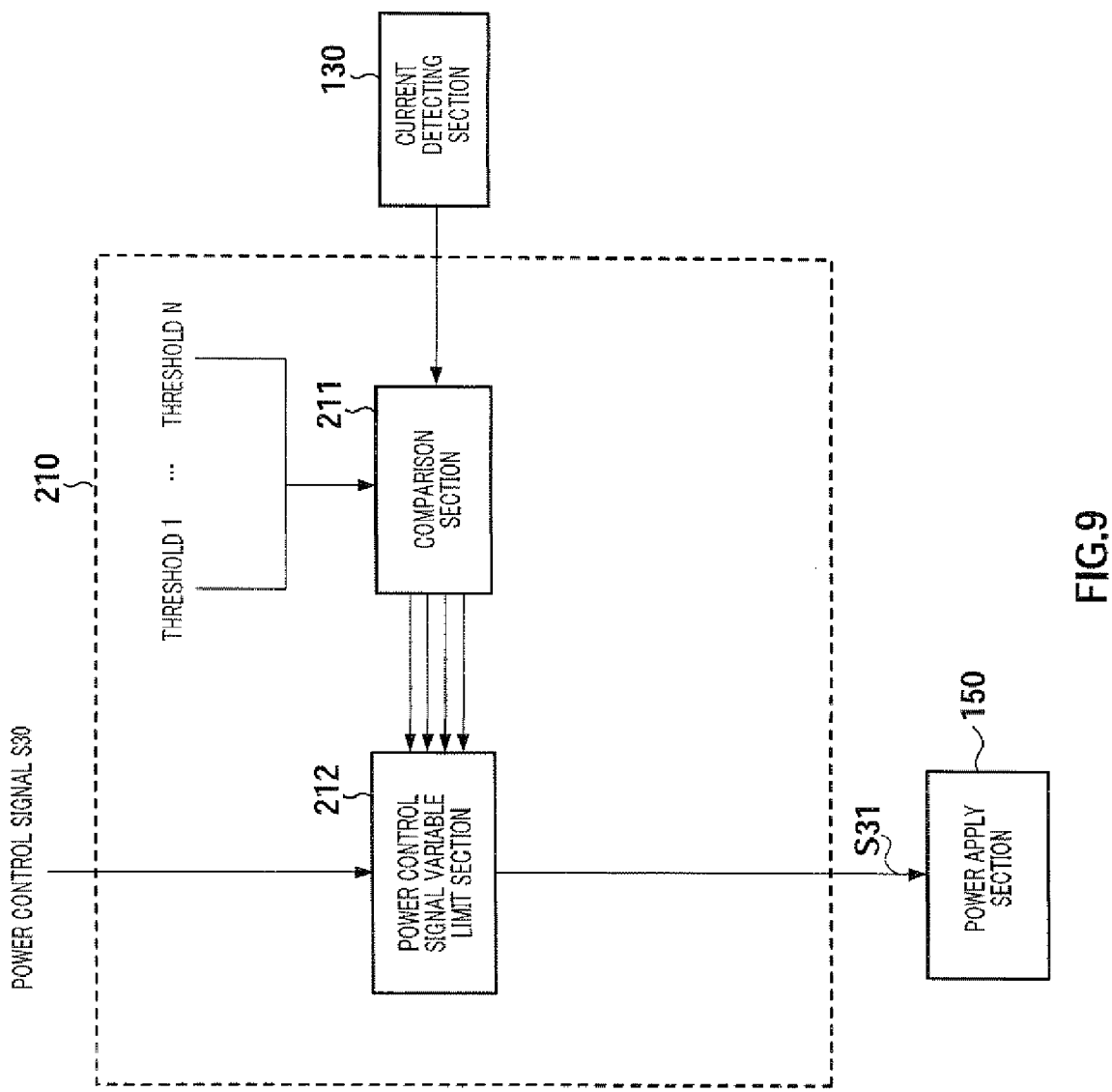
FIG. 9 is a block diagram showing a configuration of main components of a power control section according to Embodiment 3.

FIG. 9 is a block diagram showing the configuration of main components of power control section 210.

In FIG. 9, power control section 210 employs a configuration having comparison section 211 and power control signal variable limit section 212.

Comparison section 211 compares current value $I_{cc}$ outputted from current detecting section 130 to a plurality of thresholds (threshold 1 to threshold N), and outputs these results of comparison to power control signal variable limit section 212.

Power control signal variable limit section 212 changes the value for control signal S31 outputted to power apply section 150 based on the result of comparison, and outputs changed control signal S31 to power apply section 150.

In the operations of polar modulation transmission apparatus 200 employing the above-described configuration, the operation of power control section 210 will be mainly explained below.

First, comparison section 211 of power control section 210 compares current value $I_{cc}$ outputted from current detecting section 130 to a plurality of thresholds (threshold 1 to threshold N), and outputs these results to power control signal variable limit section 212.

Power control signal variable limit section 212 changes the value for control signal S31 outputted to power apply section 150 depending on between which thresholds among a plurality of thresholds 1 to N current value $I_{cc}$ is placed.

FIG. 10 illustrates the relationship between thresholds and values for control signal S31 when comparison section 211 have three thresholds 1 to 3, and, in this figure, thresholds 1 to 3 are set to 750 mA, 700 mA and 650 mA, respectively, and the output limit values are output power $P_{out}$ of power amplifier 180 for individual output values.

In the example shown in FIG. 10, the value for control signal S31 is set to 2.9 when current value $I_{cc}$ is greater than threshold 1, the value is set to 3.2 when current value $I_{cc}$ is equal to threshold 1 or between threshold 1 and threshold 2, the value is set to 3.5 when current value $I_{cc}$ is equal to threshold 2 or between threshold 2 and threshold 3, and the value is set to 3.8 when current value $I_{cc}$ is equal to less than threshold 3.

Power apply section 150 forms amplitude modulation signal S13 by multiplying baseband amplitude modulation signal S11 with control signal S31.

Regulator 160 changes power supply voltage S21 to power supply voltage S22 using amplitude modulation signal S13 and supplies changed power supply voltage 22 to power amplifier 180.

For example, when current value $I_{cc}$ is greater than threshold 1 (750 mA) and the value for control signal S31 is set to 2.9, output power $P_{out}$ of power amplifier 180 is 23 dBm. When current value $I_{cc}$ is equal to or less than threshold 1 (750 mA) and greater than threshold 2 (700 mA) and the value for control signal S31 is set to 3.2, output power $P_{out}$ of power amplifier 180 is 24 dBm. When current value $I_{cc}$ is equal to or less than threshold 2 (700 mA) and greater than threshold 2 (650 mA) and the value for control signal S31 is set to 3.5, output power $P_{out}$ of power amplifier 180 is 25 dBm. When current value $I_{cc}$ is equal to or less than threshold 3 (650 mA) and the value for control signal S31 is set to 3.8, output power $P_{out}$ of power amplifier 180 is 26 dBm.

In these cases, similar to output power $P_{out}$ of power amplifier 180, the value for power supply voltage S22 supplied from regulator 160 to power amplifier 180 becomes lower in accordance with the magnitude of control signal S31, and, in equation 1, the power difference becomes smaller between supply power supplied to power amplifier 180 ($V_{cc} \times I_{cc}$), which is the first item in equation 1, and output power $P_{out}$ of power amplifier 180, which is the second item in equation 1, so that it is possible to reduce the power loss $P_{loss}$ of power amplifier 180.

Figure 11:
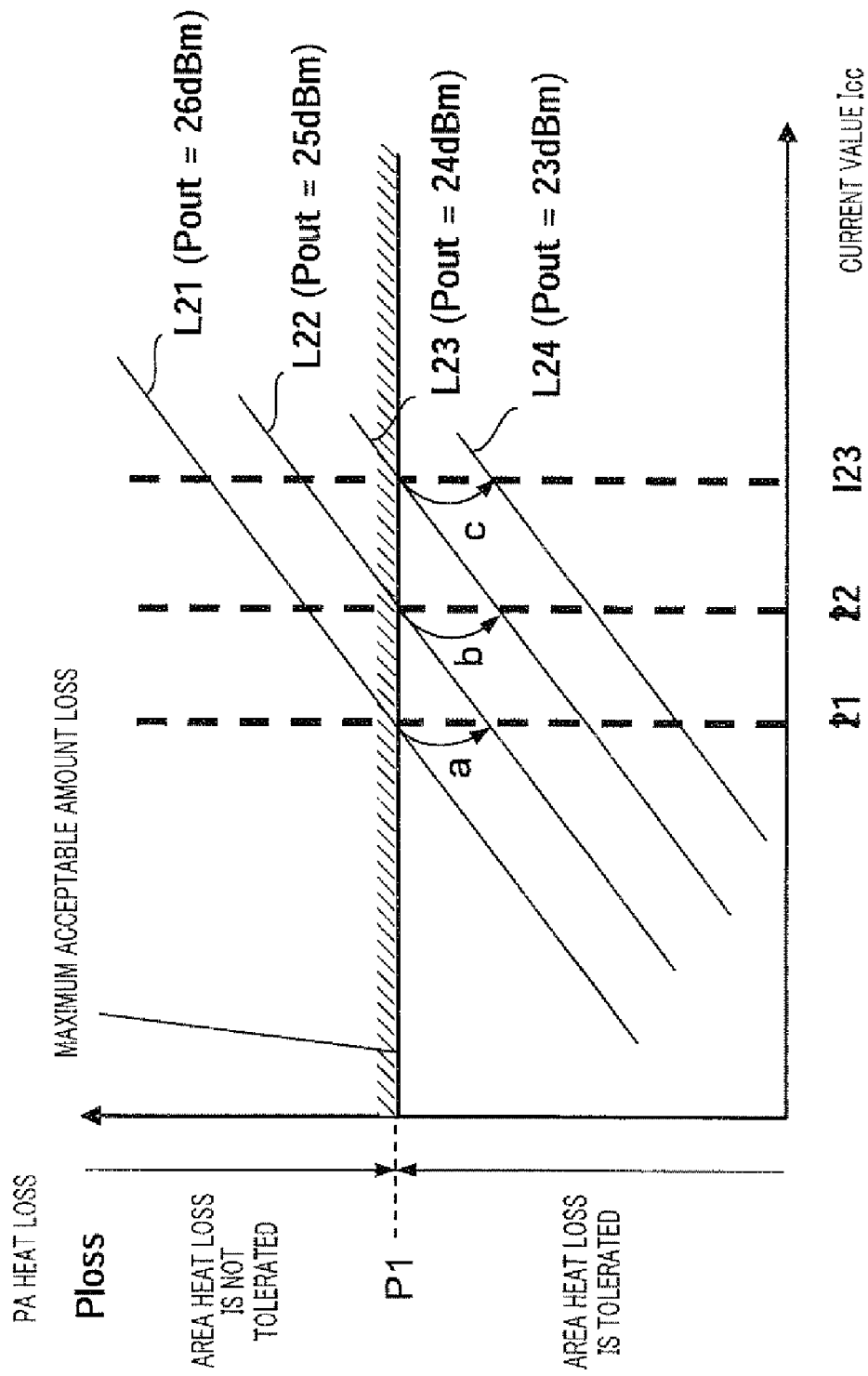
FIG. 11 illustrates a relationship between the current value for power supply voltage and the heat loss of power amplifier for explanation.

FIG. 11 illustrates the operation of power control section 210 for explanation. In FIG. 11, the horizontal axis is current value $I_{cc}$ and the vertical value is heat loss $P_{loss}$ of power amplifier 180. Further, in FIG. 11, L21 to L24 of an upward slop show the relationships between changes in current value $I_{cc}$ of when the load fluctuates and resulting heat loss $P_{loss}$, in cases where the set value for power control signal S30 is approximately 26 dBm, 25 dBm, 24 dbm and 23 dBm, respectively. Further, in FIG. 11, when the set value for power control signal S30 is approximately 26 dBm, 25 dBm and 24 dBm, I21 to I23 shows the maximum values for current value $I_{cc}$ that make heat loss $P_{loss}$ equal to or less than fixed value P1.

In the example shown in FIG. 10, I21 is 650 mA, I22 is 700 mA and I23 is 750 mA.

In this case, when the set value for power control signal S30 is approximately 26 dBm, and current value $I_{cc}$ is greater than I21 due to load fluctuation, the value for control signal S31 is changed from 3.8 to 3.5, and accompanying this, output power $P_{out}$ of power amplifier 180 is limited to 25 dBm, and the heat loss is less than P1 (see arrow "a" in FIG. 11). When current value $I_{cc}$ is greater than I22, the value for control signal S31 is changed from 3.5 to 3.2, which sets output power $P_{out}$ of power amplifier 180 to 24 dBm, and the heat loss is in the heat is within a tolerable value range (see arrow "h" in FIG. 11). When $I_{cc}$ is greater than I23, the value for control signal S31 is changed from 3.2 to 2.9, which sets output power $P_{out}$ of power amplifier 180 to 23 dBm, and the heat loss is in the heat loss is within a tolerable value range (see arrow "c" in FIG. 11).

Thus, by providing a plurality of thresholds and controlling the value for control signal S31 outputted to power apply section 150 step by step in accordance with the magnitude of current power $I_{cc}$, power supply voltage S22 supplied to power amplifier 180 is controlled step by step. By this means, it is possible to control the limit amount of the maximum output power of power amplifier 180 step by step, avoid reducing output power $P_{out}$ more than necessary and maintain adequate output power $P_{out}$, and reduce the power loss of power amplifier 180.

As described above, according to the present embodiment, comparison section 211 provides a plurality of thresholds and power control section 210 controls output power $P_{out}$ of power amplifier 180 on a per threshold basis. That is, the value for control signal S31 outputted to power apply section 150 can be controlled on a per threshold basis, so that the limit amount of the maximum output power of power amplifier 180 can be controlled step by step. By this means, it is possible to avoid reducing output power $P_{out}$ more than necessary and maintain adequate output power $P_{out}$, and reduce the power loss of power amplifier 180.

Embodiment 4

Figure 12:
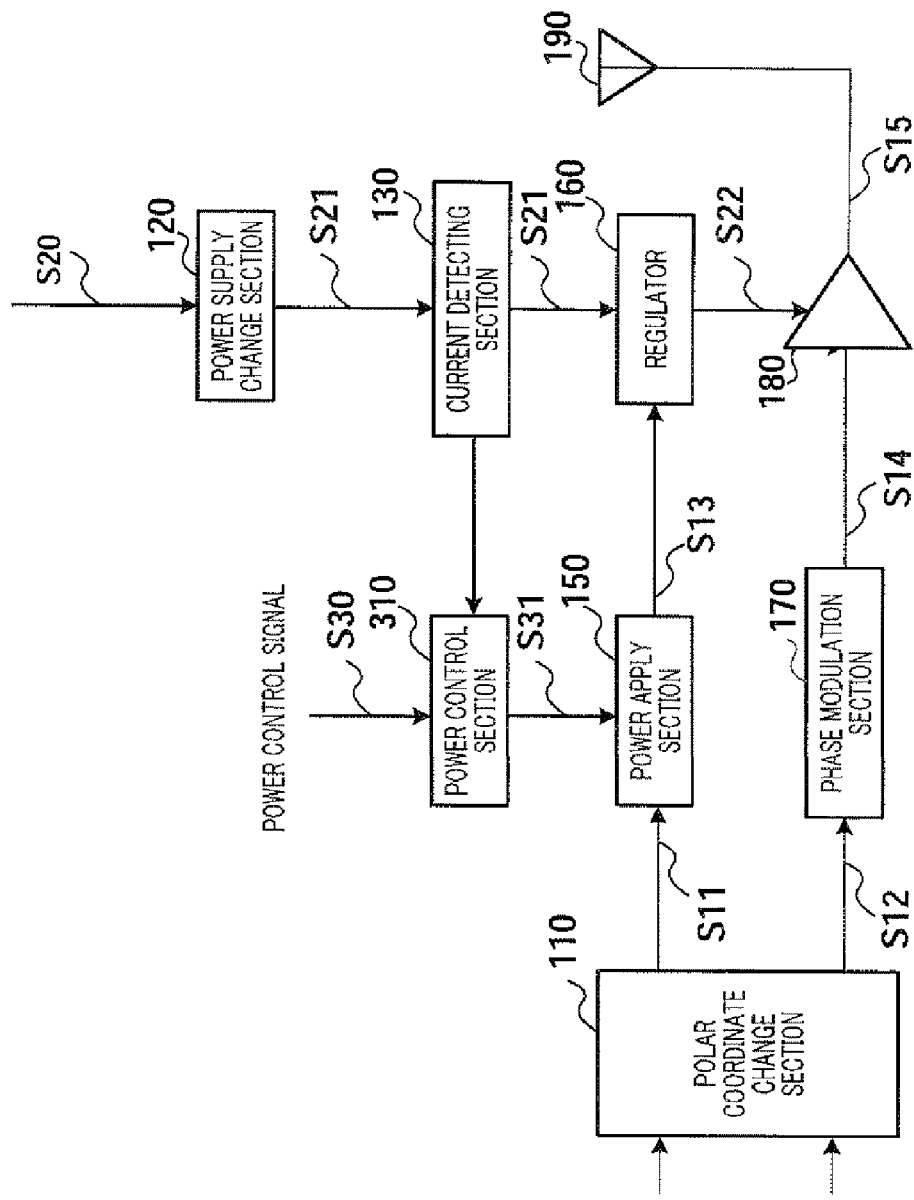
FIG. 12 is a block diagram showing a configuration of main components of a polar modulation transmission apparatus according to Embodiment 4 of the present invention.

FIG. 12 is a block diagram showing the configuration of main components of the polar modulation transmission apparatus according to Embodiment 4 of the present invention. For ease of explanation, the same components as in FIG. 4 are assigned the same reference numerals and detailed explanations thereof will be omitted.

The present embodiment is different from Embodiment 1 in that polar modulation transmission apparatus 300 has power control section 310, instead of power control section 140.

Figure 13:
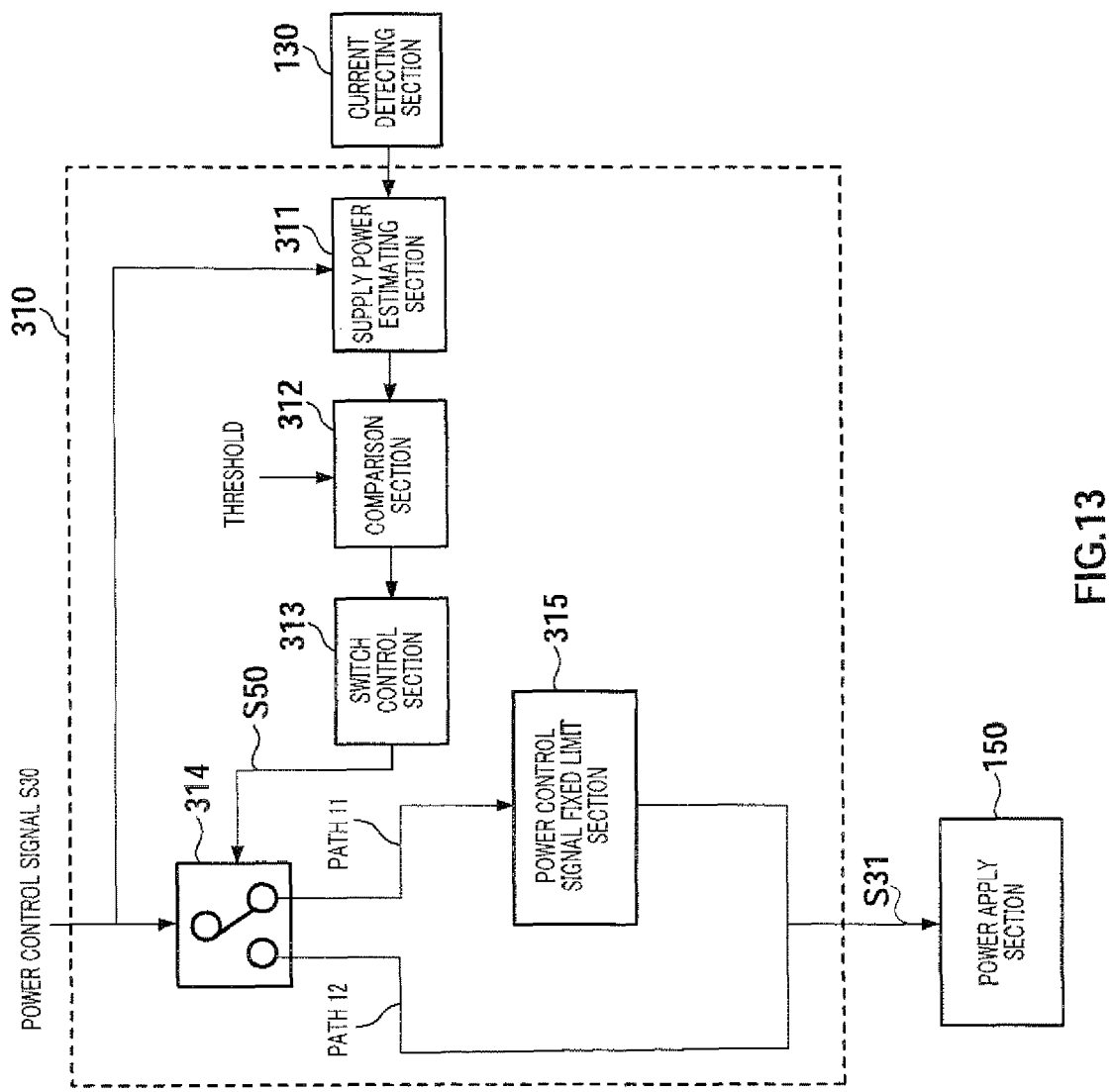
FIG. 13 is a block diagram showing a configuration of main components of a power control section according to Embodiment 4.

FIG. 13 is a block diagram showing the configuration of main components of power control section 310.

In FIG. 13, power control section 310 employs a configuration having supply power estimating section 311, comparison section 312, switch control section 313, switch 314 and power control signal fixed limit section 315.

Supply power estimating section 311 estimates supply power P0 supplied to power amplifier 180 using the following equation 2, based on current value $I_{cc}$ of power supply voltage S21 of power supply voltage change section 120 detected in current detecting section 130 and power control signal S30.

[2]

$$\text{Supply power } P0 = \text{current value } I_{cc} \times \text{power control signal value} \times \alpha \quad \text{(Equation 2)}$$

In equation 2, α is a coefficient calculated by the following equation 3 when $V_{cc}$ is the average voltage supplied to power amplifier 180 in which the power is not limited.

[3]

$$\text{Power control signal value} \times \alpha \approx V_{cc} \quad \text{(Equation 3)}$$

Comparison section 312 compares estimated supply power P0 to the predetermined threshold and outputs the result of comparison to switch control section 313.

Switch control section 313 outputs to switch 314 control signal S50 for changing the path for power control signal S30 to either path 11 or path 12, according to the result of comparison. To be more specific, switch control section 313 outputs to switch 314 control signal S50 for changing the path for power control signal S30 to path 11 if supply power P0 is greater than the threshold and for changing the path to path 12 if supply power P0 is equal to or less than the threshold.

Switch 314 changes the path for power control signal 30 in accordance with control signal S50. That is, switch 314 changes the path to path 11 if supply power P0 is greater than the threshold, and changes the path to path 12 if supply power P0 is equal to or less than the threshold.

When power control signal S30 is inputted via switch 314, power control signal fixed limit section 315 compares power control signal S30 to fixed power control signal S32 provided in power control signal fixed limit section 144, and outputs the signal having the lower value as control signal S31 to power apply section 150.

Thus, when the result of comparison in comparison section 312 shows that supply power P0 is equal to or less than the threshold, power control section 310 outputs power control signal S30 as control signal S31 to power apply section 150. On the other hand, when the result of comparison shows that supply power P0 is greater than the threshold, power control section 310 outputs to power apply section 150 the signal having the lower value between power control signal S30 and fixed power control signal S32, as control signal S31.

In the operations of polar modulation transmission apparatus 300 employing the above-described configuration, the operation of power control section 310 will be mainly explained below.

First, supply power estimating section 311 of power control section 310 estimates supply power P0 using equation 2, based on current value $I_{cc}$ outputted from current detecting section 130 and power control signal S30. Comparison section 312 compares supply power P0 to the predetermined threshold and outputs the result of comparison to switch control section 313.

When the result of comparison shows that supply power P0 is equal to or less than the threshold, switch control section 314 outputs to switch 314 control signal S50 for changing the path for power control signal S30 to path 12. On the other hand, when the result of comparison shows that supply power P0 is greater than the threshold, switch control section 314 outputs to switch 314 control signal S50 for changing the path for power control signal S30 to path 11.

As described above, when the result of comparison shows that supply power P0 is greater than the threshold, power control signal S30 is outputted to power control signal fixed limit section 315, and, when the result shows that supply power P0 is equal to or less than the threshold, power control signal S30 is outputted to power apply section 150.

When power control signal S30 is inputted to power control signal fixed limit section 315, power control signal fixed limit section 315 outputs to power apply section 150 the signal having the lower value between power control signal S30 and fixed power control signal S32, as control signal S31.

When power control signal fixed limit section 315 outputs fixed power control signal S32, the value for fixed power control signal S32 is lower than the input value for power control signal S30. Therefore, when fixed power control signal S32 is outputted as control signal S31 to power apply section 150, the level of amplitude modulation signal S13 formed in power apply section 150 is limited. Regulator 160 changes power supply voltage S21 using amplitude modulation signal S13, and, when amplitude modulation signal S13 becomes lower, reduces power supply voltage S22 supplied to power amplifier 180. That is, by reducing the power loss of power amplifier 180, it is possible to reduce the power loss, As a result, it is possible to reduce an increase of temperature of power amplifier 180 utilizing the power loss.

FIG. 14 illustrates the relationship between the input value and the output value in power control signal fixed limit section 315 as an example. In the example shown in FIG. 14, the value of threshold in comparison section 312 is 1000 mW, where control signal S31 is set to 2.9 if supply power PC estimated in supply power estimating section 311 is over 1000 mW, and where control signal S31 is set to 3.8 if supply power P0 is equal to or less than 1000 mW.

Thus, it is possible to estimate supply power from equation 2 and control the level of control signal S31 outputted to power apply section 150 according to estimated supply power P0. According to the above-described Embodiments 1 to 3, when the level of control signal S31 is controlled in accordance with current value $I_{cc}$, if current value $I_{cc}$ is fixed, even if supply power PC is not fixed, power supply voltage S22 supplied to power amplifier 180 can be controlled. On the other hand, according to the present embodiment, if supply power P0 is not fixed, power supply voltage S22 supplied to power amplifier 180 is not reliably controlled if current value $I_{cc}$ is fixed. As shown in equation 1, the power loss of power amplifier 180 fluctuates according to supply power calculated from current value $I_{cc}$. Therefore, when supply power is estimated and the amplification rate in power apply section 150 is controlled using the estimated supply power, compared to a case where the amplification rate in power apply section 150 is controlled using current value $I_{cc}$, it is possible to avoid reducing output power $P_{out}$ more than necessary and control output power $P_{out}$ of power amplifier 180 adequately.

As described above, according to the present embodiment, supply power estimating section 311 is provided, which estimates the supply power supplied to power amplifier 180 from current value $I_{cc}$ and power control signal S30, and the value for control signal S31 outputted to power apply section 150 is controlled according to estimated supply power P0, so that it is possible to control the maximum output power of power amplifier 180 adequately and reduce the heat loss of power amplifier 180 reliably. That is, when estimated supply power P0 is large, the amplification rate in power apply section 150 can be reduced by outputting to power apply section 150 fixed power control signal S32 having a lower value than the value of power control signal S30 as control signal S31, instead of power control signal S30, and modulation signal S12 can be generated in lower amplitude levels, so that it is possible to control power supply voltage S22 supplied to power amplifier 180 via regulator 160 and the power loss and the heat loss of power amplifier 180.

Figure 15:
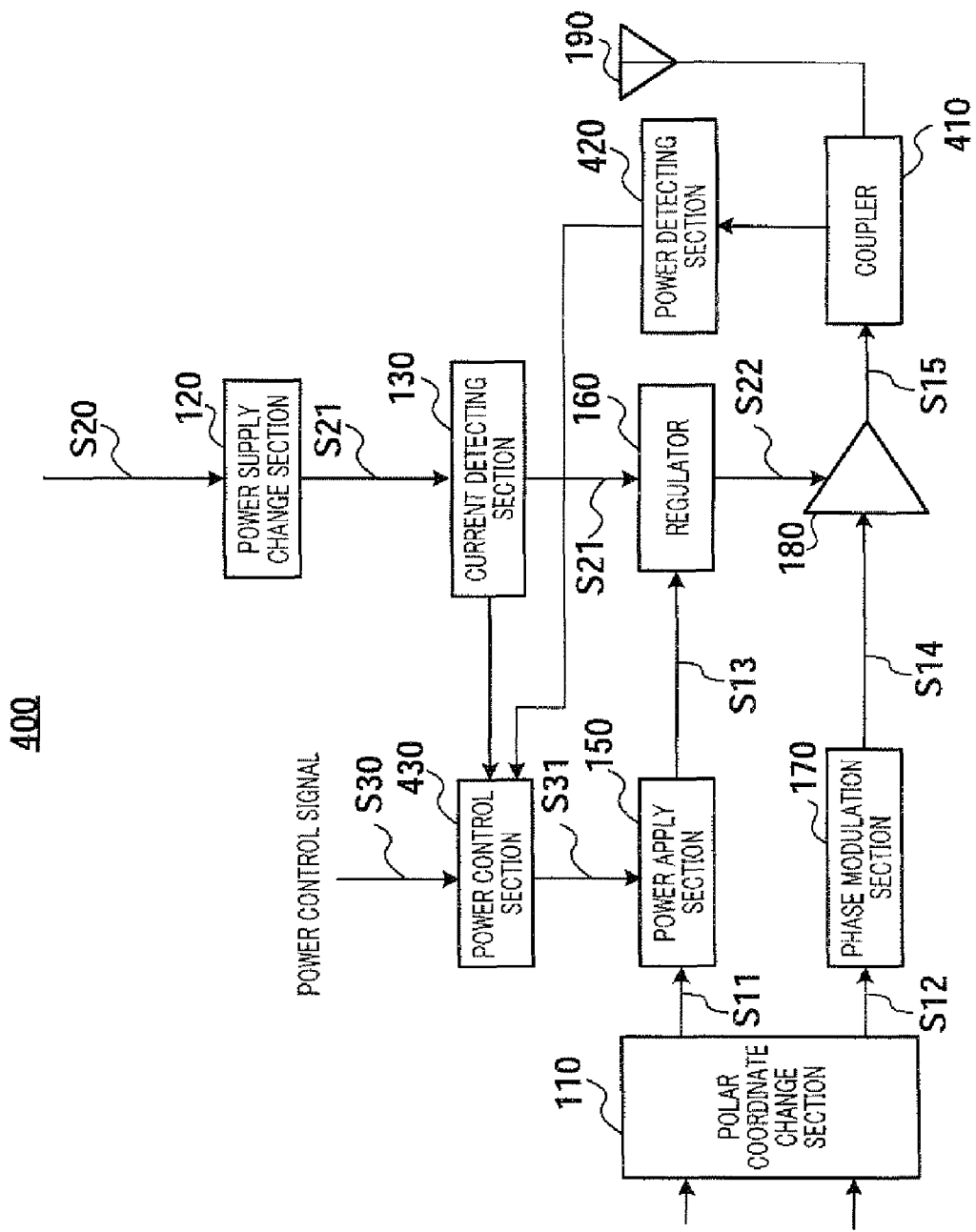
FIG. 15 is a block diagram showing a configuration of main components of a polar modulation transmission apparatus according to Embodiment 5 of the present invention.

FIG. 15 is a block diagram showing the configuration of main components of the polar modulation transmission apparatus according to Embodiment 5 of the present invention. For ease of explanation, the same components as in FIG. 4 are assigned the same reference numerals and detailed explanations thereof will be omitted. The present embodiment is different from Embodiment 1 in that polar modulation transmission apparatus 400 has power control section 430, instead of power control section 140, and further has coupler 410 and power detecting section 420.

Coupler 410 divides RF transmission signal S15 outputted from power amplifier 180 and outputs the branches to antenna 190 and power detecting section 420, respectively.

Power detecting section 420 detects the output power of power amplifier 180, that is, transmission power $P_{RF}$ of RF transmission signal S15, and outputs transmission power $P_{RF}$ of RF transmission signal S15 to power control section 430.

Figure 16:
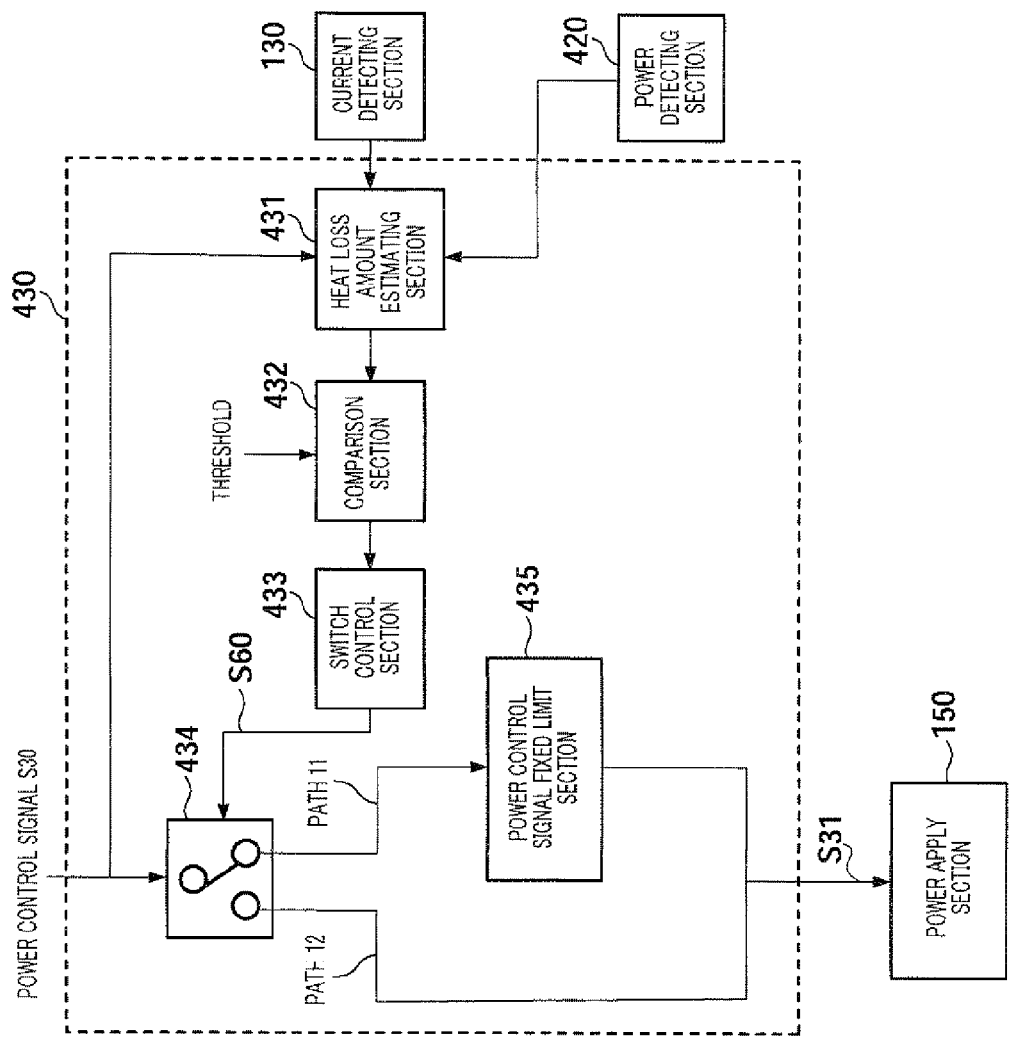
FIG. 16 is a block diagram showing a configuration of main components of a power control section according to Embodiment 5.

FIG. 16 is a block diagram showing the configuration of main components of power control section 430.

In FIG. 16, power control section 430 employs a configuration having heat loss amount estimating section 431, comparison section 432, switch control section 433, switch 434 and power control signal fixed limit section 435.

Heat loss amount estimating section 431 estimates heat loss $P_{loss}$ in power amplifier 180 using equation 1, based on current value $I_{cc}$ of power supply voltage S21 in power supply voltage change section 120, transmission power $P_{RF}$ of RF transmission signal S15 detected in power detecting section 420, and power control signal S30.

Comparison section 432 compares the amount of heat to a predetermined threshold, and outputs the result of comparison to switch control section 433.

Switch control section 433 outputs to switch 434 control signal S60 for changing the path for power control signal S30 to path 11 or path 12 according to the result of comparison. To be more specific, switch control section 433 outputs to switch 434 control signal S60 for changing the path for S30 to path 11 when the amount of heat is greater than the threshold, and for changing the path for S30 to path 12 when the amount of heat is equal to or less than the threshold.

Switch 434 changes the path for S30 according to control signal S60. That is, when the amount of heat $P_{loss}$ is greater than the threshold, switch 434 changes the path for power control signal S30 to path 11, and, when the amount of heat $P_{loss}$ is equal to or less than the threshold, switch 434 changes the path for power control signal to path 12.

When power control signal S30 is inputted via switch 434, power control signal fixed limit section 435 outputs to power apply section 150 fixed power control signal S32 having a lower value than the value for power control signal S30 as control signal S31.

Thus, when the result of comparison in comparison section 432 shows that amount of heat $P_{loss}$ is equal to or less than the threshold, power control section 430 outputs to power apply section 150 power control signal S30 as control signal S31. On the other hand, when the result of comparison shows that amount of heat $P_{loss}$ is greater than the threshold power control section 430 outputs to power apply section 150 fixed power control signal S32 having a lower value than the value for power control signal S30 as control signal S31.

In the operations of polar modulation transmission apparatus 400 employing the above-described configuration, the operation of power control section 430 will be mainly explained below.

Heat loss amount estimating section 431 of power control section 430 estimates the amount of heat loss $P_{loss}$ in power amplifier 180 using equation 2, based on current value $I_{cc}$ of power supply voltage S21 in power supply voltage change section 120, transmission power $P_{RF}$ of RF transmission signal S15 detected in power detecting section 420, and power control signal S30. Comparison section 432 compares the amount of heat loss $P_{loss}$ to a predetermined threshold and outputs the result of comparison to switch control section 433. When the result of comparison shows that the amount of heat $P_{loss}$ is equal to or less than the threshold, switch control section 433 outputs to switch 434 control signal S60 for changing the path for power control signal S30 to path 12. On the other hand, when the result of comparison shows that the amount of heat $P_{loss}$ is greater than the threshold, switch control section 433 outputs to switch 434 control signal S60 for changing the path for power control signal S30 to path 11.

Thus, when the result of comparison shows that the amount of heat $P_{loss}$ is greater than the threshold, power control signal S30 is outputted to power control signal fixed limit section 435, and, when the result of comparison shows that the amount of heat $P_{loss}$ is equal to or less than the threshold, power control signal S30 is outputted to power apply section 150.

In power control signal fixed limit section 435, when power control signal S30 is inputted, fixed power control signal S32, which limits the value for power control signal S30, is outputted to power apply section 150 as control signal S31.

When the value for fixed power control signal S32 is less than the value for power control signal S30, then fixed power control signal S32 is outputted to power apply section 150 as control signal S31. Therefore, the level of amplitude modulation signal S13 formed in power apply section 150 is limited. Regulator 160 changes power supply voltage S21 using amplitude modulation signal S13, and, when amplitude modulation signal S13 becomes smaller, reduces power supply voltage S22 supplied to power amplifier 180. That is, by reducing the power loss of power amplifier 180, it is possible to reduce the power loss.

As described above, according to the present embodiment, heat loss amount estimating section 431 is provided which estimates the heat loss of power amplifier 180 from current value $I_{cc}$, power control signal S30 and transmission power $P_{RF}$ of RF transmission signal S15, and which controls the value for control signal S31 outputted to power apply section 150 based on estimated amount of heat $P_{loss}$, so that it is possible to control the maximum output power of power amplifier 180 adequately and reduce the heat loss of power amplifier 180 reliably.

An aspect of the polar modulation transmission apparatus of the present invention employs a configuration having: a power amplifier that amplifies power of a phase component signal of a predetermined signal; a power supply; a regulator that changes a power supply voltage of the power supply according to an amplitude component signal of the predetermined signal and supplies the power supply voltage to a power supply input terminal of the power amplifier; a current detecting section that detects a value of current flowing from the power supply to the power amplifier; a power control section that limits a value of a transmission power control signal specifying transmission power, based on the current value detected in the current detecting section; and a power apply section that amplifies the amplitude component signal of the predetermined signal based on the transmission power control signal outputted from the power control section.

With this configuration, the maximum output power can be controlled by limiting the power supply voltage applied in the power amplifier, based on the value of current flowing from the power supply voltage to the power amplifier, so that it is possible to reduce the heat loss of the power amplifier.

Another aspect of the polar modulation transmission apparatus of the present invention employs a configuration in which the predetermined threshold used for comparison with the value of current detected in the current detecting section is a first threshold when the power supply voltage supplied to the power supply input terminal of the power amplifier is limited, and the predetermined threshold is a second threshold different from the first threshold when the limit is cancelled for the power supply voltage supplied to the power supply terminal of the power amplifier.

With this configuration, only when the result of comparison shows that the value of current flowing from power supply voltage to power amplifier is greater than the threshold, it is possible to limit the maximum output power of the power amplifier and reduce the heat loss of the power amplifier reliably by simple control of limiting the value for the transmission power control signal.

Another aspect of the polar modulation transmission apparatus of the present invention employs a configuration in which the predetermined threshold used for comparison with the value of current detected in the current detecting section is a first threshold when the power supply voltage supplied to the power supply input terminal of the power amplifier is limited, and the predetermined threshold is a second threshold different from the first threshold when the limit is cancelled for the power supply voltage supplied to the power supply terminal of the power amplifier.

With this configuration, the lower threshold than the threshold to start limiting the maximum output power of the power amplifier is used as the threshold to cancel the limit of the maximum output power of the power amplifier, so that hysteresis is formed on current value $I_{cc}$ upon starting limiting output power $P_{out}$ and on current value $I_{cc}$ upon canceling the limit, and uniform transmission power is outputted even when current value $I_{cc}$ fluctuates a little.

Another aspect of the polar modulation transmission of the present invention employs a configuration in which, when a plurality of predetermined thresholds are provided, the power control section limits the value of the transmission power, based on the value of current detected in the current detecting section and the result of comparison in the comparison section.

With this configuration, the power supply voltage supplied to the power amplifier can be controlled step by step according to the current value, so that it is possible to avoid reducing the output power of the power amplifier more than necessary compared to a case where a threshold is fixed, and control the output power adequately.

Another aspect of the polar modulation transmission apparatus of the present invention employs a configuration in which: the power control section further includes: a supply power estimating section that estimates a supply power supplied to the power amplifier based on the current value detected in the current detecting section and the transmission power control signal; and a comparison section that compares the supply power to a predetermined threshold; and when the result of comparison in the comparison section shows that the supply power is greater than the predetermined threshold, the power control section limits the value of the transmission power control signal.

With this configuration, by estimating supply power, limiting the power supply voltage applied to the power amplifier and limiting the maximum power of the power amplifier, it is possible to avoid reducing the output power of power amplifier more than necessary and control the output power of the power amplifier adequately.

Another aspect of the polar modulation transmission apparatus of the present invention employs a configuration further having an output power detecting section that detects an output power of the power amplifier, in which: the power control section further includes: a heat loss amount estimating section that estimates the amount of heat loss in the power amplifier, based on the output power, the current value detected in the current detecting section and the transmission power control signal; and a comparison section that compares the amount of heat loss in the power amplifier to a predetermined threshold; and when the result of comparison shows that the amount of heat loss is greater than the predetermined thresholds the power control section limits the value of the transmission power control signal.

With this configuration, the heat loss of the power amplifier is estimated and the maximum power of the power amplifier is limited by limiting the power supply voltage applied to the power amplifier, so that it is possible to avoid reducing the output power of power amplifier more than necessary and reduce the output power of the power amplifier reliably.

According to the polar modulation transmission apparatus of the present invention, it is possible to reduce the heat loss of a power amplifier without using isolators and reduce the circuit scale. Therefore, especially, the polar modulation transmission apparatus of the present invention is applicable to the transmission apparatus using a polar modulation scheme.

What is claimed is:

1. A polar modulation transmission apparatus comprising:
a power amplifier that amplifies power of a phase component signal of a predetermined signal;
a power supply;
a regulator that changes a power supply voltage of the power supply according to an amplitude component signal of the predetermined signal and supplies the power supply voltage to a power supply input terminal of the power amplifier;
a current detecting section that detects a value of current flowing from the power supply to the power amplifier;
a power control section that limits, based on the current value detected in the current detecting section, a value of a transmission power control signal specifying transmission power;
a power apply section that adjusts a level of the amplitude component signal of the predetermined signal based on the transmission power control signal outputted from the power control section; and
a comparison section that compares the current value detected in the current detecting section to a predetermined threshold, wherein:
the power control section limits the value of the transmission power control signal when the comparison result shows that the current value is greater than the predetermined threshold, and
the predetermined threshold used for comparison with the value of current detected in the current detecting section is a first threshold when the power supply voltage supplied to the power supply input terminal of the power amplifier has a limit, and the predetermined threshold is a second threshold different from the first threshold when the limit for the power supply voltage supplied to the power supply input terminal of the power amplifier is cancelled.

2. A polar modulation transmission apparatus comprising:
a power amplifier that amplifies power of a phase component signal of a predetermined signal;
a power supply;
a regulator that changes a power supply voltage of the power supply according to an amplitude component signal of the predetermined signal and supplies the power supply voltage to a power supply input terminal of the power amplifier;
a current detecting section that detects a value of current flowing from the power supply to the power amplifier;
a power control section that limits, based on the current value detected in the current detecting section, a value of a transmission power control signal specifying transmission power;
a power apply section that adjusts a level of the amplitude component signal of the predetermined signal based on the transmission power control signal outputted from the power control section; and
an output power detecting section that detects an output power of the power amplifier, wherein:
the power control section further comprises:
a heat loss amount estimating section that estimates the amount of heat loss in the power amplifier, based on the output power, the current value detected in the current detecting section and the transmission power control signal; and
a comparison section that compares the amount of heat loss in the power amplifier to a predetermined threshold; and when the comparison result shows that the amount of heat loss is greater than the predetermined threshold, the power control section limits the value of the transmission power control signal.

3. A polar modulation transmission apparatus comprising:
a power amplifier that amplifies power of a phase component signal of a predetermined signal;
a power supply;
a regulator that changes a power supply voltage of the power supply according to an amplitude component signal of the predetermined signal and supplies the power supply voltage to a power supply input terminal of the power amplifier;
a current detecting section that detects a value of current flowing from the power supply to the power amplifier;
a power control section that limits, based on the current value detected in the current detecting section, a value of a transmission power control signal specifying transmission power; and
a power apply section that adjusts a level of the amplitude component signal of the predetermined signal based on the transmission power control signal outputted from the power control section, wherein
the power control section compares the current value detected in the current detecting section to a predetermined threshold, and, when the current value is equal to or lower than the predetermined threshold, outputs the transmission power control signal specifying the transmission power or, when the current value is greater than the predetermined threshold, outputs a predetermined transmission power control signal.

4. The polar modulation transmission apparatus according to claim 3, wherein, when a plurality of predetermined thresholds are provided, the power control section limits the value of the transmission power control signal, based on the current value detected in the current detecting section and the comparison result in the power control section.

5. The polar modulation transmission apparatus according to claim 3, wherein:
the power control section further comprises:
a supply power estimating section that estimates a supply power supplied to the power amplifier based on the current value detected in the current detecting section and the transmission power control signal; and a comparison section that compares the supply power to a predetermined threshold; and when the comparison result in the comparison section shows that the supply power is greater than the predetermined threshold, the power control section limits the value of the transmission power control signal.

* * * * *